(12) United States Patent
Kim et al.

(10) Patent No.: US 10,067,819 B2
(45) Date of Patent: Sep. 4, 2018

(54) DATA STORAGE DEVICE AND OPERATING METHOD THEREOF

(71) Applicant: SK hynix Inc., Gyeonggi-do (KR)

(72) Inventors: Se Hyun Kim, Gyeonggi-do (KR); Jeen Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 97 days.

(21) Appl. No.: 15/230,156

(22) Filed: Aug. 5, 2016

(65) Prior Publication Data

US 2017/0277588 A1    Sep. 28, 2017

(30) Foreign Application Priority Data

Mar. 28, 2016   (KR) .......................... 10-2016-0036730

(51) Int. Cl.
  *G06F 11/07*   (2006.01)
  *G11C 16/10*   (2006.01)
  *G11C 16/26*   (2006.01)
  *G06F 3/06*    (2006.01)

(52) U.S. Cl.
  CPC .......... *G06F 11/0793* (2013.01); *G06F 3/064* (2013.01); *G06F 3/0619* (2013.01); *G06F 3/0679* (2013.01); *G06F 11/079* (2013.01); *G06F 11/0727* (2013.01); *G06F 11/0754* (2013.01); *G11C 16/10* (2013.01); *G11C 16/26* (2013.01)

(58) Field of Classification Search
  CPC ............. G06F 11/1012; G06F 11/1048; G06F 11/0793; G06F 11/1016; G06F 11/1076; G06F 11/079; G06F 11/08; G11C 16/10; G11C 16/3414; G11C 16/3418; G11C 16/30; G11C 16/349
  See application file for complete search history.

(56) References Cited

U.S. PATENT DOCUMENTS

| 8,812,933 | B2 * | 8/2014 | Joo | ........................ | G11C 16/10 |
| | | | | | 365/185.09 |
| 9,128,623 | B2 * | 9/2015 | Mun | ....................... | G11C 16/10 |
| 2008/0072009 | A1 * | 3/2008 | Kim | ..................... | G06F 12/0862 |
| | | | | | 711/206 |
| 2014/0310534 | A1 * | 10/2014 | Gurgi | ................... | G06F 12/1408 |
| | | | | | 713/193 |
| 2014/0372714 | A1 * | 12/2014 | Lee | ...................... | G06F 11/1048 |
| | | | | | 711/154 |

FOREIGN PATENT DOCUMENTS

KR          101554159          9/2015

* cited by examiner

*Primary Examiner* — Nadeem Iqbal
(74) *Attorney, Agent, or Firm* — IP & T Group LLP

(57) ABSTRACT

A data storage device includes a nonvolatile memory device; a randomizing unit configured to randomize data to be stored in the nonvolatile memory device and derandomize data read from the nonvolatile memory device, by using seed values; and a control unit configured to, in the case where return is made from a power failure state to a normal state, detect a page of the nonvolatile memory device in which a power problem has occurred, and randomize data of the page in which the power problem has occurred, by using a seed value that is different from a seed value corresponding to the page in which the power problem has occurred, through the randomizing unit.

15 Claims, 9 Drawing Sheets

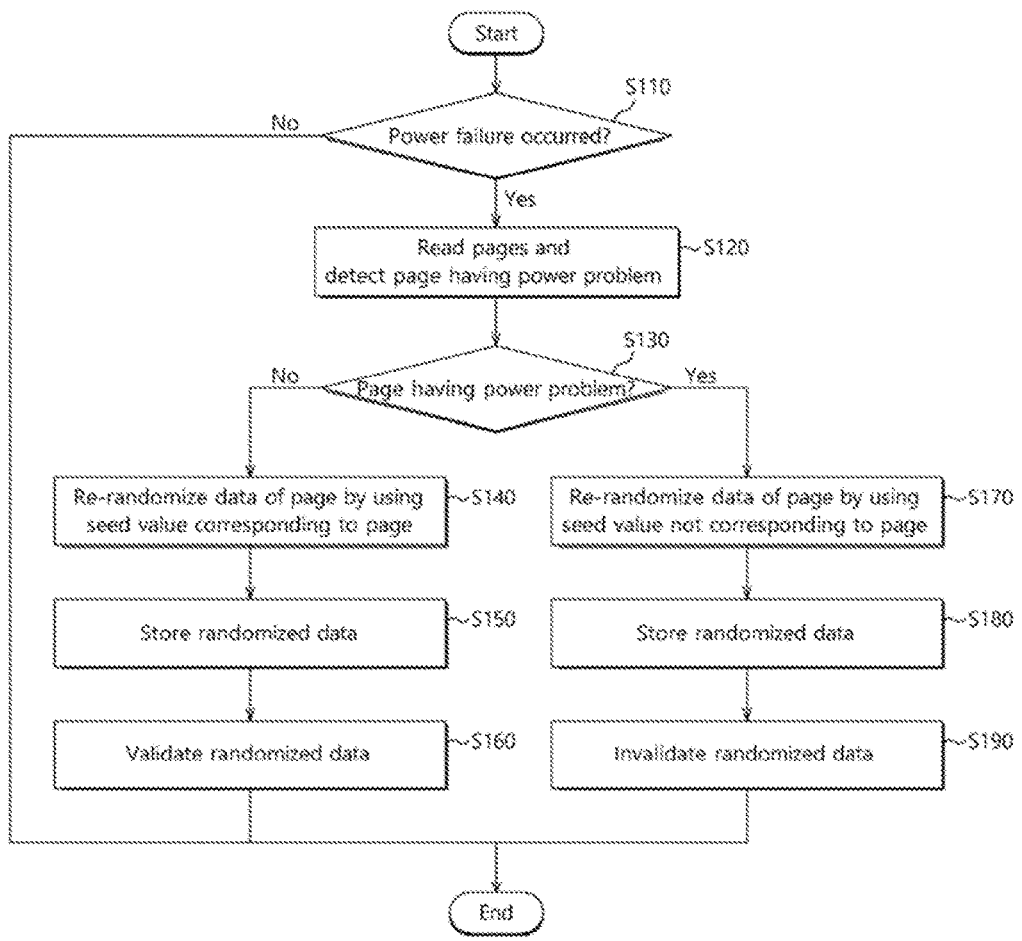

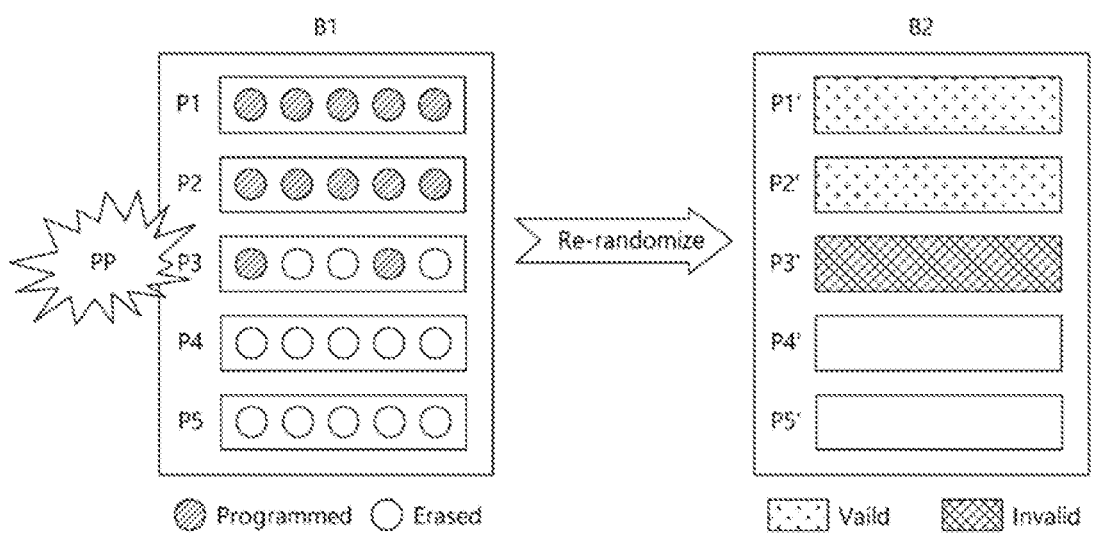

DATA STORAGE DEVICE AND OPERATING METHOD THEREOF

CROSS-REFERENCES TO RELATED APPLICATION

The present application claims priority under 35 U.S.C. § 119(a) to Korean application number 10-2016-0036730, filed on Mar. 28, 2016, in the Korean Intellectual Property Office, which is incorporated herein by reference in its entirety.

BACKGROUND

1. Technical Field

Various embodiments generally relate to a data storage device that uses a nonvolatile memory device as a storage medium.

2. Related Art

Recently, the paradigm for the computer environment has shifted into ubiquitous computing so that computer systems can be used anytime and anywhere. Due to this, use of portable electronic devices such as mobile phones, digital cameras, and notebook computers has rapidly increased. In general, such portable electronic devices use a data storage device which uses a memory device. A data storage device is used to store data to be used in a portable electronic device.

A data storage device using a memory device provides advantages in that, since there is no mechanical driving part, stability and durability are excellent, an information access speed is high and power consumption is small. Data storage devices having such advantages include a universal serial bus (USB) memory device, memory cards having various interfaces, a universal flash storage (UFS) device, and a solid state drive (SSD).

SUMMARY

Various embodiments are directed to a data storage device capable of improving data reliability.

In an embodiment, a data storage device may include: a nonvolatile memory device; a randomizing unit configured to randomize data to be stored in the nonvolatile memory device and derandomize data read from the nonvolatile memory device, by using seed values; and a control unit configured to, in the case where return is made from a power failure state to a normal state, detect a page of the nonvolatile memory device in which a power problem has occurred, and randomize data of the page in which the power problem has occurred, by using a seed value that is different from a seed value corresponding to the page in which the power problem has occurred, through the randomizing unit.

In an embodiment, a method for operating a data storage device which uses a nonvolatile memory device including pages, as a storage medium may include: detecting a page in which a power problem has occurred, in the case where return is made from a power failure state to a normal state; recovering data of a page for which an operation was completed before the power problem has occurred; and destroying data of the page in which the power problem has occurred.

According to the embodiments, since it is possible to decrease the possibility of a read error, reliability of data stored in a data storage device may be improved.

BRIEF DESCRIPTION OF THE DRAWINGS

FIG. 4 is a flow chart of an operation of a power failure recovery module, according to an embodiment of the present invention.

FIG. 5 is a diagram illustrating an example of states of pages of a nonvolatile memory device to assist in the explanation of the operation of the power failure recovery module, according to an embodiment of the present invention.

FIG. 6 is a table illustrating examples of seed values used in a power failure recovery operation, according to an embodiment of the present invention.

DETAILED DESCRIPTION

Figure 1:
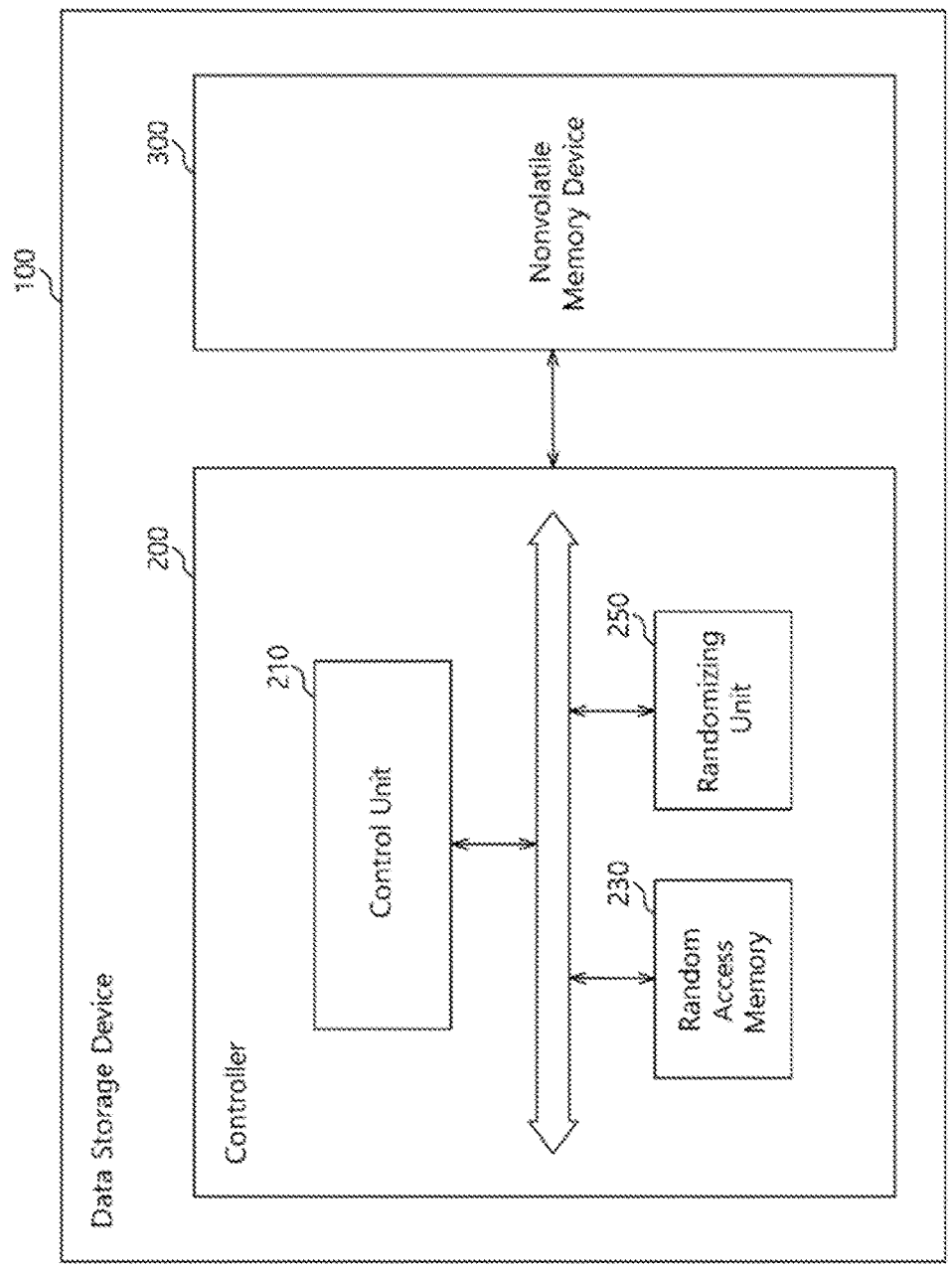
FIG. 1 is a block diagram illustrating an example of a data storage device, according to an embodiment of the present invention.

In the present invention, advantages, features and methods for achieving them will become more apparent after a reading of the following embodiments taken in conjunction with the drawings. The present invention may, however, be embodied in different forms and should not be construed as being limited to the embodiments set forth herein. Rather, these embodiments are provided to describe the present invention in detail to the extent that a person skilled in the art to which the invention pertains can practice the present invention.

It is to be understood herein that embodiments of the present invention are not limited to the particulars shown in the drawings and that the drawings are not necessarily to scale and in some instances proportions may have been exaggerated in order to more clearly depict certain features of the invention. While particular terminology is used herein, it is to be appreciated that the terminology used herein is for the purpose of describing particular embodiments only and is not intended to limit the scope of the present invention.

As used herein, the term "and/or" includes any and all combinations of one or more of the associated listed items. It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise. It will be further understood that the terms "includes," "including," "comprises," and/or "comprising," when used in this specification, specify the presence of at least one stated feature, step, operation, and/or element, but do not preclude the presence or addition of one or more other features, steps, operations, and/or elements thereof.

Hereinafter, various embodiments, including a data storage device and an operating method thereof will be described below with reference to the accompanying drawings.

Figure 2:
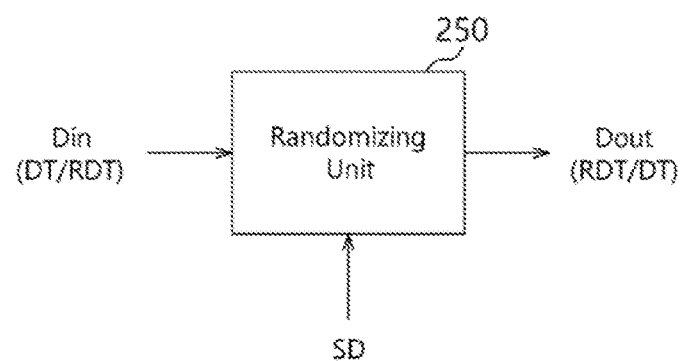
FIG. 2 is a diagram illustrating an example of a randomizing unit, according to an embodiment of the present invention.

Referring now to FIG. 1 a data storage device 100 is provided, according to an embodiment of the present invention. FIG. 2 illustrates an example of a randomizing unit employed in the data storage device of FIG. 1.

The data storage device 100 may store data to be accessed by a host device (not shown), such as, a mobile phone, an MP3 player, a laptop computer, a desktop computer, a game player, a TV, an in-vehicle infotainment system, and so forth. The data storage device 100 may also be referred to as a memory system.

The data storage device 100 may be manufactured as any one of various storage devices and may be coupled, according to a host interface transmission protocol to a host device. For example, the data storage device 100 may be configured as any one of various storage devices such as, a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and the like.

The data storage device 100 may be manufactured as any one among various packages, such as, a package-on-package (POP), a system-in-package (SIP), a system-on-chip (SOC), a multi-chip package (MCP), a chip-on-board (COB), a wafer-level fabricated package (WFP) and a wafer-level stack package (WSP).

The data storage device 100 may include a controller 200 and a nonvolatile memory device 300.

The nonvolatile memory device 300 may be used as the storage medium of the data storage device 100. The nonvolatile memory device 300 may be configured by any one of various nonvolatile memory devices such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PCRAM) using a chalcogenide alloy, and a resistive random access memory (RERAM) using transition metal oxide.

The ferroelectric random access memory (FRAM), the magnetic random access memory (MRAM), the phase-change random access memory (PCRAM) and the resistive random access memory (RERAM) are examples of nonvolatile random access memory devices capable of random access to memory cells. In an embodiment, the nonvolatile memory device 300 may be configured by a combination of a NAND flash memory device and at least one of the above-described various nonvolatile random access memory devices. For instance, the nonvolatile memory device 300 which is configured by a NAND flash memory device will be exemplified in the following descriptions.

The controller 200 may include a control unit 210, a random access memory 230, and a randomizing unit 250 and an internal bus.

The control unit 210 may control one or more of the general operations of the controller 200. The control unit 210 may drive an instruction or an algorithm of a code type, for example, a software, loaded in the random access memory 230, and may control operations of function blocks in the controller 200. The control unit 210 may analyze and process a request of the host device, which is transmitted through the host interface.

The random access memory 230 may store a soft are to be driven by the control unit 210. The random access memory 230 may store data necessary for driving of the software. That is to say, the random access memory 230 may operate as the working memory of the control unit 210.

The random access memory 230 may operate as a data buffer memory or a data cache memory. For example the random access memory 230 may temporarily store data to be transmitted from the host device to a nonvolatile memory device 300 or from the nonvolatile memory device 300 to the host device.

In an embodiment, the random access memory 230 may be configured by a volatile memory device, such as, a dynamic RAM (DRAM) or a static RAM (SRAM). In another embodiment, the random access memory 230 may be configured by a nonvolatile memory device, such as, a ferroelectric random access memory (FRAM), a magnetic random access memory (MRAM), a phase-change random access memory (PCRAM) and a resistive random access memory (RERAM).

As shown in FIG. 2, the randomizing unit 250 logically calculate inputted data Din and a seed value SD, randomize or de-randomize the inputted data Din, and output data Dout. The randomizing and de-randomizing operation may be reversible operations that use the same seed value. That is to say, that original data and its randomized data may be reversibly translated into each other with the same seed value.

For instance, in the case where data DT to be stored in the nonvolatile memory device 300 is inputted, the randomizing unit 250 may randomize the data DT and output randomized data RDT. For another instance, in the case where the randomized data RDT read from the nonvolatile memory device 300 is inputted, the randomizing Unit 250 may de-randomize the randomized data RDT and output the original data DT.

In general, the randomizing unit 250 may use the same seed value both when randomizing the original data DT and when de-randomizing the randomized data RDT of the original data DT.

In an exceptional case, the randomizing unit 250 may use different seed values when randomizing the original data DT and when de-randomizing the randomized data RDT of the original data DT. An exceptional case may occur, for example, when the data storage device 100 returns from an unexpected power failure, which will be described below in detail.

Figure 3:
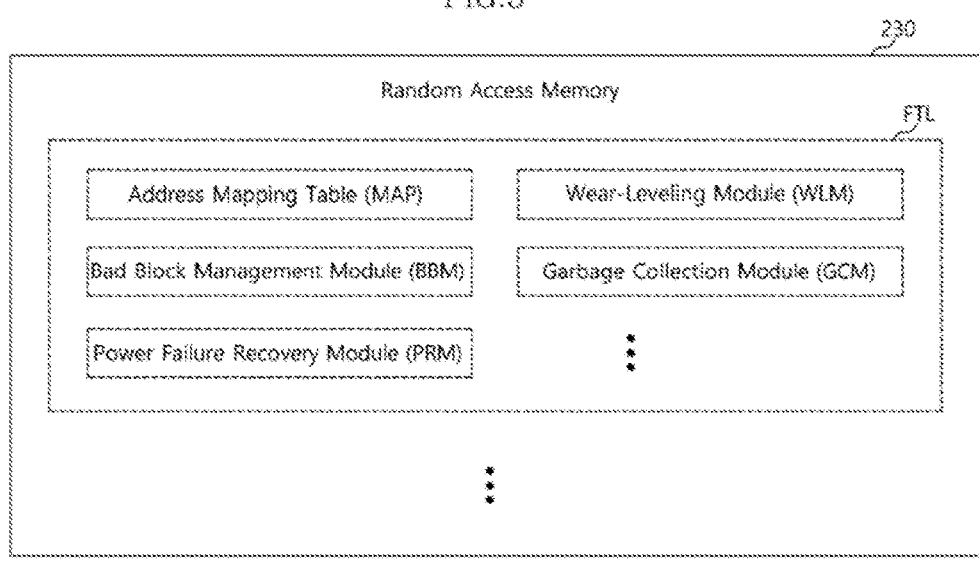
FIG. 3 is a diagram illustrating an example of a software to be driven in a random access memory employed in the data storage device shown in FIG. 1, according to an embodiment of the present invention.

FIG. 3 illustrates an example of a software to be driven in the random access memory shown in FIG. 1.

In the case where the nonvolatile memory device 300 is configured by a NAND flash memory device, the control unit: 210 may control the erase operation of the nonvolatile memory device 300 in units of memory blocks, and control the read and program (or write) operations of the nonvolatile memory device 300 in units of pages. Further, since it is generally not possible for a nonvolatile memory device 300 to perform an overwrite operation, the control unit 210 may perform an erase operation in advance for storing new data in memory cells in which data are stored.

The control unit 210 of the data storage device 100 may drive a flash translation layer FTL in order to control the intrinsic operations of the nonvolatile memory device 300 configured by a flash memory device and provide device compatibility to the host device. Through driving of such a flash translation layer FTL, the data storage device 100 may be recognized as a general data storage device such as, a hard disk by the host device.

The flash translation layer FTL loaded on the random access memory 230 may be configured by modules for performing various functions and metadata necessary for driving of the modules. For example, as illustrated in FIG. 3, the flash translation layer FTL may include an address mapping table MAP, a wear-leveling module WLM, a bad block management module BBM, a garbage collection module GCM, and a power failure recovery module PRM.

In the case where the host device accesses the data storage device 100 (for example, requests a read operation or a write operation of data), the host device may provide a logical address to the data storage device 100. The flash translation layer FTL may translate the provided logical address into a physical address of the nonvolatile memory device 300, and perform a requested operation by referring to the converted physical address. For performing the address translation operation, address translation data, that is, the address mapping table MAP may be included in the flash translation is layer FTL.

The wear-leveling module WLM may manage wear levels for memory blocks of the nonvolatile memory device 300. Memory cells of the nonvolatile memory device 300 may be aged by repeated erase and program operations. Aged memory cells, that is, worn-out memory cells may cause fails (for example, physical defects). The wear-leveling module WLM may manage the erase-write counts of respective memory blocks in such a way as to be spread more evenly between the memory blocks, to prevent a certain memory block from being worn out earlier than other memory blocks.

The bad block management module BBM may manage a memory block in which a fail has occurred, among the memory blocks of the nonvolatile memory device 300. As described above, a fail (for example, a physical defect) may occur in a worn-out memory cell. Data stored in a failed memory cell may not be normally read out. Moreover, data may not be normally stored in a failed memory cell. The bad block management module BBM may manage a memory block which has a failed memory cell, in such a way as to prevent its further use.

An erase operation of the nonvolatile memory device 300 requires a lengthy time. For this reason, the control unit 210 does not erase a memory cell currently storing to-be-updated data or rewrite update data in the erased memory cell for servicing a current write request for replacing the to-be-updated data with the update data. Instead, the control unit 210 stores the update data in another io memory cell, which is already erased, other than the memory cell currently storing the to-be-updated data. By this operation of the control unit 210, valid data and invalid data are mixed in the nonvolatile memory device 300. As the occasion demands, the control unit 210 may perform a series of operations of collecting valid data to a place and erasing memory cells stored with invalid data, that is, a garbage collection operation. The garbage collection operation may be referred to as a merge operation.

If power supplied to the data storage device 100 is abruptly cut off while performing a program operation to memory cells, the program operation to the nonvolatile memory device 300 is interrupted and thus not normally completed. The power failure recovery module PRM may manage, when the data storage device 100 is returned from an unexpected power failure, a memory cell, a page or a memory block which has a high probability of an error due to the power failure. The power failure recovery operation of the power failure recovery module PRM will be described below in detail.

FIG. 4 is an example of a flow chart to assist in the explanation of the operation of the power failure recovery module PRM according to the embodiment. FIG. 5 is a diagram exemplifying an example of states of pages of the nonvolatile memory device 300 to assist in the explanation of the operation of the power failure recovery module according to an embodiment of the present invention. FIG. 6 is an example of a table to assist in the explanation of seed values used in the power failure recovery operation, according to an embodiment of the present invention.

As an example, for illustration purposes only, two memory blocks B1 and B2 each including five pages each page configured by five memory cells are illustrated in FIG. 5. Further, it is assumed that the pages included in each of the memory blocks B1 and B2 are programmed in ascending order.

Referring now to FIG. 4 at step S110, the power failure recovery module PRM may determine whether a power failure has occurred or not. Unless return is made from a power failure state to a normal state, the operation of the power failure recovery module PRM may be ended.

Conversely, in the case where return is made from a power failure state to a normal state, the power failure recovery module PRM may perform a power failure recovery operation including detecting steps S120 and S130 of detecting a page (hereinafter, referred to as a "power-problem page") in which a power problem PP has occurred during the program operation thereto, a recovering steps S140 to S160 of recovering data of a page (hereinafter, referred to as a "program-completed page") to which the program operation is completed before the power problem PP has occurred, and destroying steps S170 to S190 of destroying data of a page (hereinafter, referred to as a "program-interrupted page") to which the program operation is interrupted due to the power problem PP.

At step S120, the power failure recovery module PRM may read pages of a memory block and detect a power-problem page.

As aforementioned, for storing new data in memory cells already storing data, an erase operation should be performed in advance. This means that memory cells of erased states are not programmed yet. For instance, the power failure recovery module PRM may detect the power-problem page by detecting erased pages including the memory cells all of which are erased.

For example, referring to FIG. 5, the power failure recovery module PRM may read pages P1 to P5 of the first memory block B1 according to a program sequence, and firstly detect the page P4 as the erased page between erased pages P4 and P5. The power failure recovery module PRM may determine or detect a page previous to the erased page P4 according to a program sequence, that is, the page P3 programmed before the erased page P4 in the program sequence, as the power-problem page. The power-problem page may be fortunately but rarely if ever the power-completed page. The power-problem page may have a high probability of the program-interrupted page. In an embodiment, the power failure recovery module PRM may determine the power-problem page P3 of FIG. 5 as the program-interrupted page.

The power failure recovery module PRM may recover data of the program-completed pages (for example, the pages P1 and P2 of FIG. 5) through steps S140 to S160.

At step S140, the power failure recovery module PRM may re-randomize data of the program-completed pages with the seed values corresponding to the program-completed page through the randomizing unit 250. The seed values corresponding to the program-completed pages may be the ones used when randomizing and de-randomizing the data of the program-completed pages. Therefore the power failure recovery module PRM may re-randomize data of the program-completed pages with the same seed values as used in the de-randomizing operation.

For example, referring to FIG. 6, the power failure recovery module PRM may re-randomize data of the program-completed first page P1 with a first seed value SD1 corresponding to the first page P1. The first seed value SD1 corresponding to the first page P1 may be used in de-randomizing the data of the first page P1. Also, the power failure recovery module PRM may re-randomize data of the program-completed second page P2 with a second seed value SD2 corresponding to the second page P2. The second seed value SD2 corresponding to the second page P2 may be used in de-randomizing the data of the second page P2.

At step S150, the power failure recovery module PRM may store the re-randomized data of the program-completed pages P1 and P2 into another storage region (e.g., the second memory block B2). At step S160, the power failure recovery module PRM may validate the re-randomized data stored in the second memory block 62.

For example, referring to FIG. 5, the power failure recovery module PRM may store the re-randomized data of the program-completed first page P1 in a first page P1' of the second memory block B2. Further, the power failure recovery module PRM may validate the data stored in the first page P1' of the second memory block B2. The power failure recovery module PRM may store the re-randomized data of the second page P2 in a second page P2' of the second memory block B2. Further, the power failure recovery module PRM may validate the data stored in the second page P2' of the second memory block B2.

The power failure recovery module PRM may destroy data of the program-interrupted page (for example, the page P3 of FIG. 5) through steps S170 to S190.

A memory cell of the program-interrupted page may be storing incomplete data. Moreover, the memory cell of the program-interrupted page may have a high probability to cause a read fail due to an effect or a mechanism exerting adverse influences such as, disturbance, coupling with an adjacent memory cell, and so forth. Therefore, it may be necessary to intentionally destroy and assuredly invalidate data of the program-interrupted page. Data may be destroyed by changing the data so that the data cannot be recovered to its original value or for making an error correction to the changed data impossible.

According to an embodiment, data of the program-interrupted page may be destroyed by re-randomizing with a seed value that is different from the seed value corresponding to the program-interrupted page. In other words, data of the program-interrupted page may be re-randomized with a seed value that is different from a seed value used when de-randomizing the data of the program-completed page. In the case where the data of the program-interrupted page is re-randomized with a seed value that is different from the seed value corresponding to the program-interrupted page, it is impossible to de-randomize the re-randomized data with a seed value corresponding to the program-interrupted page. This may mean that the data of program-interrupted page is destroyed through the re-randomization with the seed value that different from the seed value corresponding to the program-interrupted page.

At step S170, the power failure recovery module PRM may re-randomize data of the program-interrupted page with the seed value that is different from the seed value corresponding to the program-interrupted page through the randomizing unit 250.

For example, referring to FIG. 6, the power failure recovery module PRM may re-randomize data of the third page P3 (i.e., the program-interrupted page) with a seed value SDr different from the seed value SD3 corresponding to the third page P3 or the program-interrupted page. The random seed value SDr used in re-randomizing the data of the third page P3 as the program-interrupted page is not used in de-randomizing the data of the third page P3. That is to say, in the case of de-randomizing the data of the third page P3 as the program-interrupted page, an original seed value SD3 corresponding to the third page P3 may be used. Accordingly, the data of the third page P3 which are re-randomized by using the different random seed value SDr may not be recovered to original data even though it is de-randomized with the original seed value SD3, and this may mean that the data of the third page P3 as the program-interrupted page is destroyed.

At step S180 the power failure recovery module PRM may store the re-randomized data of the page P3 or the program-interrupted page. At step S190, the power failure recovery module PRM may invalidate the re-randomized data.

For example, referring to FIG. 5, the power failure recovery module PRM may store the re-randomized data of the third page P3 or the program-interrupted page into a third page P3' of the second memory block B2. Further, the power failure recovery module PRM may invalidate the data stored in the third page P3' of the second memory block B2. In other words, the power failure recovery module PRM may invalidate data so that the data which are destroyed by the re-randomizing operation is not accessed in a subsequent operation.

Figure 7:
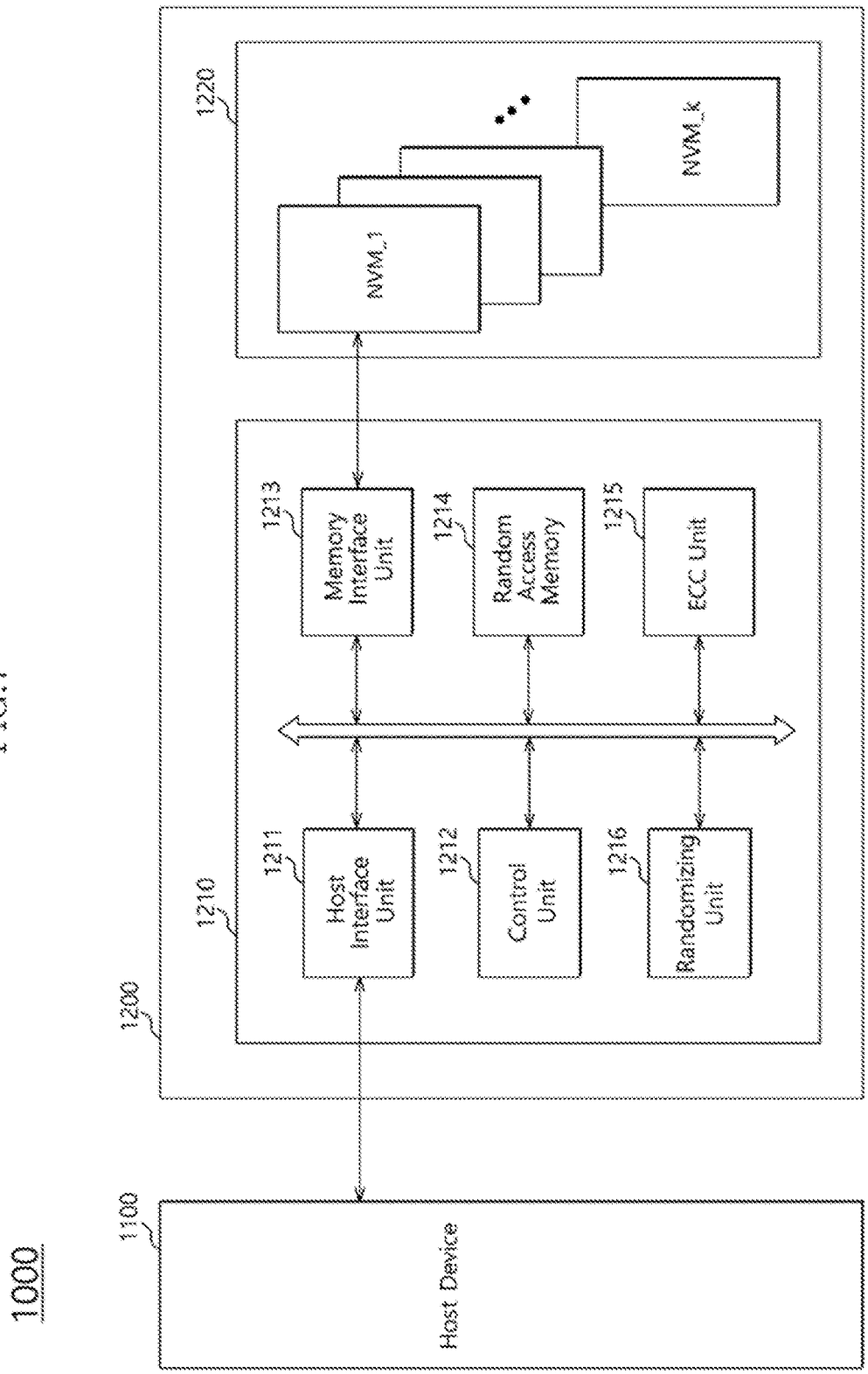
FIG. 7 is a block diagram illustrating a data processing system including a data storage device, according to an embodiment of the present invention.

FIG. 7 illustrates a data processing system 1000 including a data storage device 1200, according to an embodiment of the present invention. According to the embodiment of FIG. 7, the data processing system 1000 includes a data storage device 1200 coupled to a host device 1100.

The data storage device 1200 may include a controller 1210 and a nonvolatile memory device 1220. The data storage device 1200 may be used by being coupled to the host device 1100 such as a mobile phone, an MP3 player, a laptop computer, a desktop io computer, a game player, a TV, an in-vehicle infotainment system, and the like. The data storage device 1200 is also referred to as a memory system.

The controller 1210 may include a host interface unit 1211, a control unit 1212, a memory interface unit 1213, a random access memory 1214, an error correction code (ECC) unit 1215, and a randomizing unit 1216, operatively coupled via an internal bus.

The control unit 1212 may control the general operations of the controller 1210 in response to a request from the host device 1100. For example, the control unit 1212 may drive a firmware or a software for controlling the nonvolatile memory device 1220.

The control unit 1212 may detect the power-problem page of the nonvolatile memory device 1220. The control unit 1212 may re-randomize data of the program-interrupted page with a seed value that is different from an original seed value corresponding to the program-interrupted page through the randomizing unit 1216. Accordingly, the data of the unstable page in which the power problem has occurred may be intentionally destroyed and may be invalidated reliably.

The random access memory 1214 may be used as the working memory of the control unit 1212. The random access memory 1214 may be used as a buffer memory which temporarily stores data read out from the nonvolatile memory device 1220 or data provided from the host device 1100.

The host interface unit 1211 may interface the host device 1100 and the controller 1210. For example, the host interface unit 1211 may communicate with the host device 1100 through one of various interface protocols, such as, a universal serial bus (USB) protocol, a universal flash storage (UFS) protocol, a multimedia card (MMC) protocol, a peripheral component interconnection (PCI) protocol, a PCI express (PCI-E) protocol, parallel advanced technology attachment (PATA) protocol, a serial advanced technology attachment (SATA) protocol, a small computer system interface (SCSI) protocol, and a serial attached SCSI (SAS) protocol.

The memory interface unit 1213 may interface the controller 1210 and the nonvolatile memory device 1220. The memory interface unit 1213 may provide a command and an address to the nonvolatile memory device 1220. Furthermore, the memory interface unit 1213 may exchange data with the nonvolatile memory device 1220.

The error correction code (ECC) unit 1215 may ECC-encode data to be stored in the nonvolatile memory device 1220. Also, the error correction code (ECC) unit 1215 may ECC-decode data read out from the nonvolatile memory device 1220.

The nonvolatile memory device 1220 may be used as the storage medium of the data storage device 1200. The nonvolatile memory device 1220 may include a plurality of nonvolatile memory chips (or dies) NVM_1 to NVM_k.

The controller 1210 and the nonvolatile memory device 1220 may be manufactured as any one of various data storage devices. For example, the controller 1210 and the nonvolatile memory device 1220 may be integrated into one semiconductor device and may be manufactured as any one of a multimedia card in the form of an MMC, an eMMC, an RS-MMC and a micro-MMC a secure digital card in the form of an SD, a mini-SD and an micro-SD, a universal serial bus (USB) storage device, a universal flash storage (UFS) device, a Personal Computer Memory Card International Association (PCMCIA) card, a compact flash (CF) card, a smart media card, a memory stick, and the like.

Figure 8:
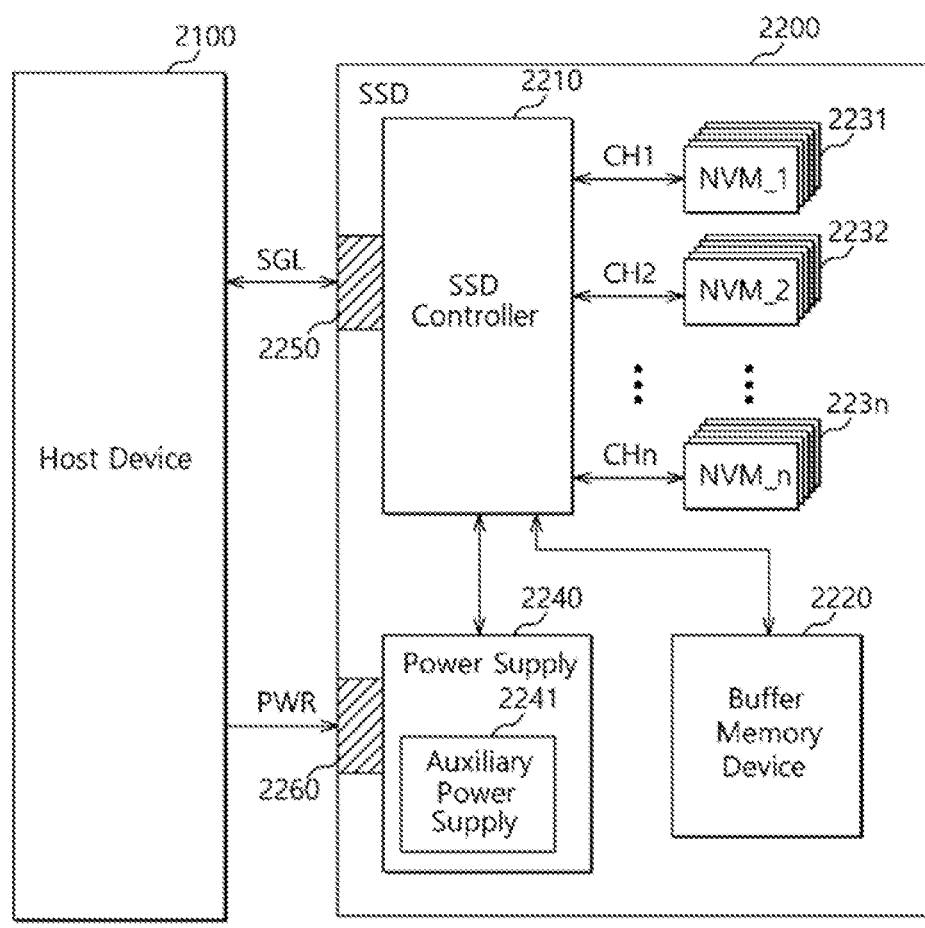
FIG. 8 is a block diagram illustrating a data processing system including a solid state drive (SSD), according to an embodiment of the present invention.

FIG. 8 illustrates a data processing system 2000 including a solid state drive (SSD) 2200, according to an embodiment of the present invention. Referring to FIG. 8, the data processing system 2000 may include a host device 2100 and a solid state drive (SSD) 2200.

The SSD 2200 may include an SSD controller 2210, a buffer memory device 2220, nonvolatile memory devices 2231 to 223n, a power supply 2240, a signal connector 2250, and a power connector 2260.

The SSD controller 2210 may access the nonvolatile memory devices 2231 to 223n in response to a request from the host device 2100.

The buffer memory device 2220 may temporarily store data to be stored in the nonvolatile memory devices 2231 to 223n. Further, the buffer memory device 2220 may temporarily store data read out from the nonvolatile memory devices 2231 to 223n. The data temporarily stored in the buffer memory device 2220 may be, transmitted to the host device 2100 or the nonvolatile memory devices 2231 to 223n under control of the SSD controller 2210.

The nonvolatile memory devices 2231 to 223n may be used as storage media of the SSD 2200. The nonvolatile memory devices 2231 to 223n may be coupled with the SSD controller 2210 through a plurality of channels CH1 to CHn, respectively. One or more nonvolatile memory devices may be coupled to one channel. The nonvolatile memory devices coupled to each channel may be coupled to the same signal bus and data bus.

The power supply 2240 may provide power PWR inputted through the power connector 2260, to the inside of the SSD 2200. The power supply 2240 may include an auxiliary power supply 2241. The auxiliary power supply 2241 may supply power to allow the SSD 2200 to be normally terminated when a sudden power-off occurs. The auxiliary power supply 2241 may include large capacitance capacitors capable of charging power PWR.

The SSD controller 2210 may exchange a signal SGL with the host device 2100 through the signal connector 2250. The signal SGL may include a command, an address, data, and so forth. The signal connector 2250 may be configured by a connector, such as, of universal flash storage (UFS), parallel advanced technology attachment (PATA), serial advanced technology attachment (SATA), small computer system interface (SCSI), serial attached SCSI (SAS), peripheral component interconnection (PCI) and PCI express (PCI-E) protocols, according to an interface scheme between the host device 2100 and the SSD 2200.

Figure 9:
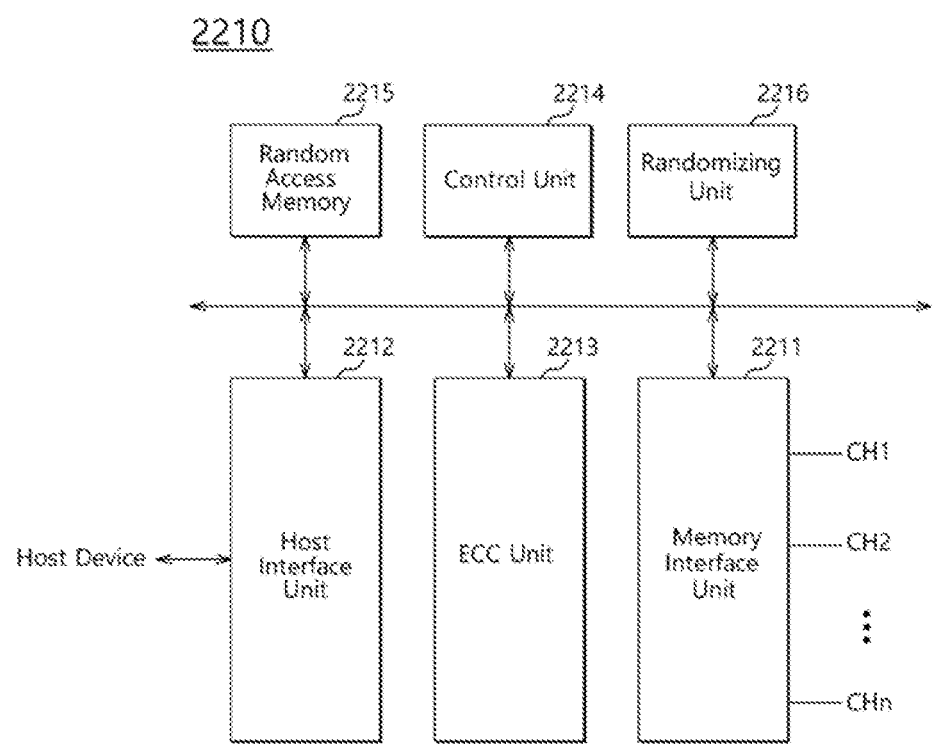
FIG. 9 is a block diagram illustrating an example of the SSD controller employed in the SSD of FIG. 8, according to an embodiment of the present invention.

FIG. 9 illustrates an example for the SSD controller shown in FIG. 8 Referring to FIG. 9, the SSD controller 2210 may include a memory interface unit 2211, a host interface unit 2212, an error correction code (ECC) unit 2213, a control unit 2214, a random access memory 2215, and a randomizing unit 2216, coupled thorough an internal bus.

The memory interface unit 2211 may provide control signals such as commands and addresses to the nonvolatile memory devices 2231 to 223n. Moreover, the memory interface unit 2211 may exchange data with the nonvolatile memory devices 2231 to 223n. The memory interface unit 2211 may diffuse data transmitted from the buffer memory device 2220 to the respective channels CH1 to CHn, under control of the control unit 2214. Furthermore, the memory interface unit 2211 may transmit data read out from the nonvolatile memory devices 2231 to 223n to the buffer memory device 2220, under control of the control unit: 2214.

The host interface unit 2212 may provide interfacing with respect to the SSD 2200 in correspondence to the protocol of the host device 2100. For example, the host interface unit 2212 may communicate with the host device 2100 through any one of universal flash storage (UFS), parallel advanced technology attachment (PATA), serial advanced technology attachment (SATA), small computer system interface (SCSI), serial attached SCSI (SAS), peripheral io component interconnection (PCI) and PCI express (PCI-E) protocols. In addition, the host interface unit 2212 may perform a disk emulating function of supporting the host device 2100 to recognize the SSD 2200 as a hard disk drive (HDD).

The control unit 2214 may analyze and process the signal SGL inputted from the host device 2100. The control unit 2214 may control operations of the buffer memory device 2220 and the nonvolatile memory devices 2231 to 223n according to a firmware or a software for driving the SSD 2200. The random access memory 2215 may be used as a working memory for driving the firmware or the software.

The control unit 2214 may detect a power-problem page of the nonvolatile memory devices 2231 to 223n. The control unit 2214 may re-randomize data of the program-interrupted page by using a seed value that is different from an original seed value corresponding to the program-interrupted page through the randomizing unit 2216.

Accordingly, the data of the unstable page in which the power problem has occurred may be intentionally destroyed and may be invalidated in a reliable manner.

The error correction code (ECC) unit 2213 may generate parity data to be transmitted to the nonvolatile memory devices 2231 to 223n, among data stored in the buffer memory device 2220. The generated parity data may be stored, along with data, in the nonvolatile memory devices 2231 to 223n. The error correction code (ECC) unit 2213 may detect an error of the data read out from the nonvolatile memory devices 2231 to 223n. When the detected error is within a correctable range, the error correction code (ECC) nit 2213 may correct the detected error.

Figure 10:
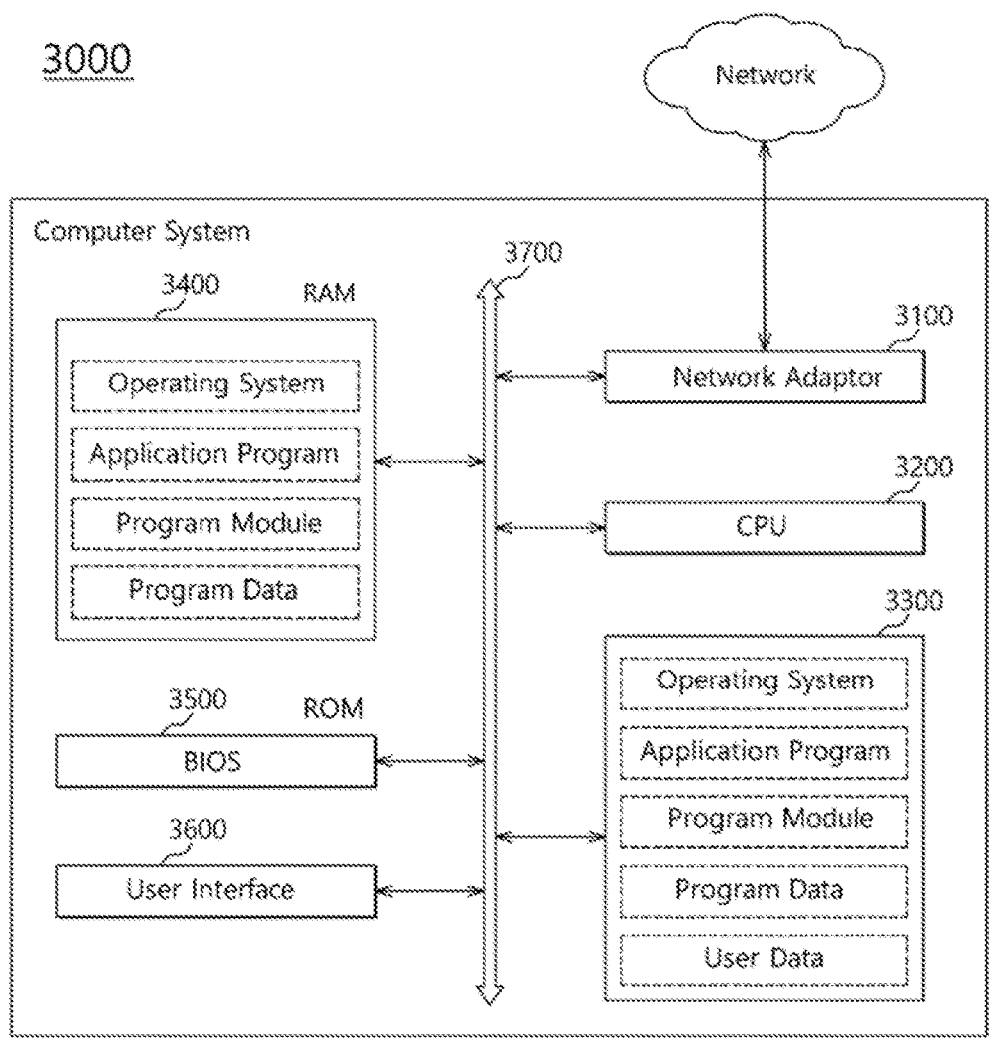
FIG. 10 is a block diagram illustrating a computer system including including a data storage device, according to an embodiment of the present invention.

FIG. 10 is a block diagram illustrating an example of a computer system to which a data storage device is mounted according to an embodiment of the present invention. Referring to FIG. 10, a computer system 3000 includes a network adaptor 3100, a central processing unit 3200, a data storage device 3300, a RAM 3400, a ROM 3500 and a user interface 3600, which are electrically coupled to a system bus 3700. The data storage device 3300 may be configured by the data storage device 100 shown in FIG. 1, the data storage device 1200 shown in FIG. 7 or the SSD 2200 shown in FIG. 8.

The network adaptor 3100 may provide interfacing between the computer system 3000 and external networks. The central processing unit 3200 may perform general calculation processing for driving an operating system residing at the RAM 3400 or an application program.

The data storage device 3300 may store general data needed in the computer system 3000. For example, an operating system for driving the computer system 3000, an application program, various program modules, program data and user data may be stored in the data storage device 3300.

The RAM 3400 may be used as the working memory of the computer system 3000. Upon booting, the operating system, the application program, the various program modules and the program data needed for driving programs, which are read out from the data storage device 3300, may be loaded in the RAM 3400. A BIOS (basic input/output system) which is activated before the operating system is driven may be stored in the ROM 3500. Information exchange between the computer system 3000 and a user may be implemented through the user interface 3600.

Figure 11:
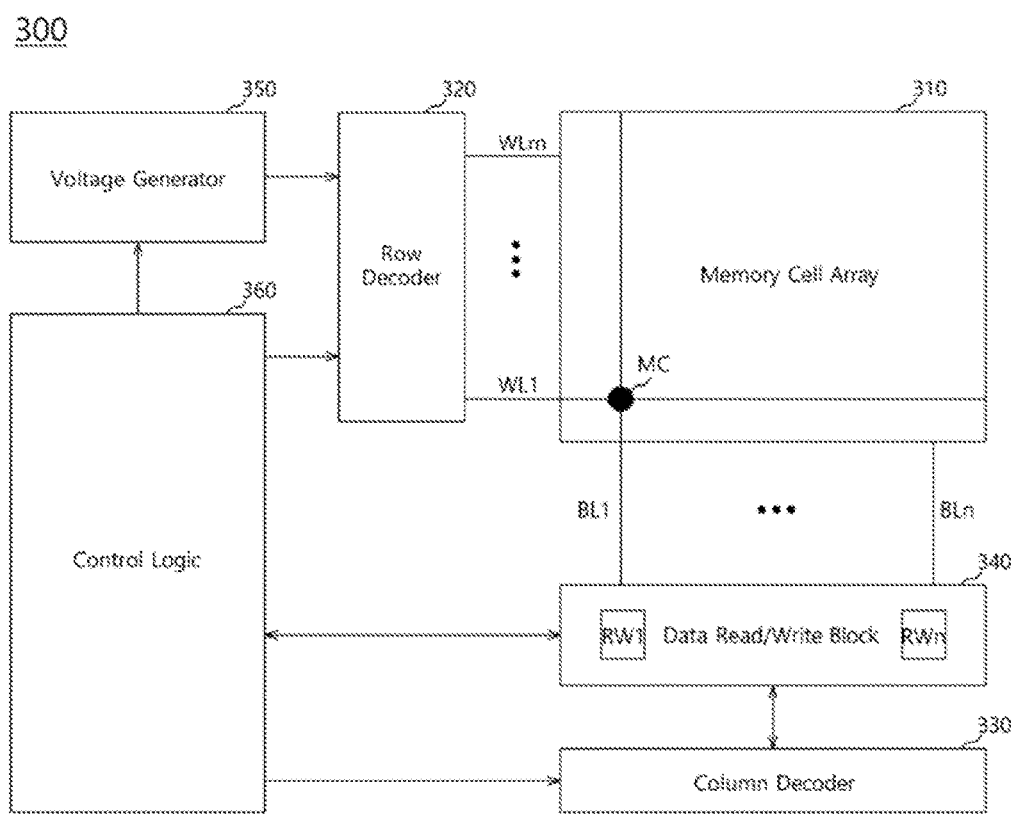
FIG. 11 is block diagram illustrating an example of a nonvolatile memory device included in a data storage device, according to an embodiment of the present invention.

FIG. 11 is a block diagram illustrating an example of a nonvolatile memory device included in a data storage device, according to an embodiment of the present invention. Referring to FIG. 11, a nonvolatile memory device 300 may include a memory cell array 310, a row decoder 320, a column decoder 330, a data read/write block 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 340 may be coupled with the memory cell array 310 through the bit lines BL1 to BLn. The data read/write block 340 may include read/write circuits RW1 to RWn respectively corresponding to the bit lines BL1 to BLh. The data read/write block 340 may operate according to control of the control logic 360. The data read/write block 340 may operate as a write driver or a sense amplifier according to an operation mode For example, the data read/write block 340 may operate as a write driver which stores data provided from the external device, in the memory cell array 310 in a write operation. For another example, the data read/write block 340 may operate as a sense amplifier which reads out data from the memory cell array 310 in a read operation.

The column decoder 330 may operate according to control of the control logic 360. The column decoder 330 may decode an address provided from the external device. The column decoder 330 may couple the read/write circuits RW1 to RWn of the data read/write block 340 respectively corresponding to the bit lines BL1 to BLn with data input/output lines (or data input/output buffers), based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control operations of the nonvolatile memory device 300 such as read, write and erase operations of the nonvolatile memory device 300.

While various embodiments have been described above, it will be understood to those skilled in the art that the embodiments described are examples only. Accordingly, the data storage device and the operating method thereof described herein should not be limited based on the described embodiments. Also, we note that in some instances, as would be apparent to those skilled in the art to which this invention pertains, an element or feature described in connection with one embodiment may be used singly or in combination with other features or elements of another embodiment, unless specifically indicated otherwise.

What is claimed is:

1. A data storage device comprising:
a nonvolatile memory device;
a randomizing unit suitable for randomizing data to be stored in a page of the nonvolatile memory device and derandomizing data read from the page of the nonvolatile memory device, with a seed value; and
a control unit suitable for, in the case where return is made from a power failure state to a normal state, detecting a program-interrupted page of the nonvolatile memory device in which a power problem has occurred, and controlling the randomizing unit to re-randomize data of the program-interrupted page with a second seed value that is different from a first seed value corresponding to the program-interrupted page.

2. The data storage device according to claim 1, wherein the control unit stores the re-randomized data in an empty page, and invalidates the re-randomized data.

3. The data storage device according to claim 1, wherein the control unit controls the randomizing unit to derandomize the re-randomized data with the first seed value.

4. The data storage device according to claim 1, wherein, in the case where return is made from the power failure state to the normal state, the control unit detects a program-completed page of the nonvolatile memory device in which a power problem has not occurred, and re-randomizes data of the program-completed page with a first seed value corresponding to the program-completed page.

5. The data storage device according to claim 4, wherein the control unit stores the data re-randomized with the first seed value corresponding to the program-completed page in an empty page, and validates the re-randomized data.

6. The data storage device according to claim 5, wherein the control unit controls the randomizing unit to derandomize the re-randomized data with the first seed value corresponding to the program-completed page.

7. The data storage device according to claim 1, wherein the control unit detects a page for which a program operation is interrupted as the program-interrupted page.

8. The data storage device according to claim 7, wherein the control unit detects a page before an erased page in a program sequence as the program-interrupted page.

9. A method for operating a data storage device including a nonvolatile memory device, the method comprising:
detecting a program-interrupted page in which a power problem has occurred, in the case where return is made from a power failure state to a normal state;
recovering data of a program-completed page for which an operation was completed before the power problem has occurred; and
destroying data of the program-interrupted page,
wherein the destroying comprises re-randomizing data of the program-interrupted page with a second seed value that is different from a first seed value corresponding to the program-interrupted page.

10. The method according to claim 9, further comprising:
storing the re-randomized data of the program-interrupted page in an empty page; and
invalidating the re-randomized data of the program-interrupted page.

11. The method according to claim 9, further comprising:
derandomizing the re-randomized data of the program-interrupted page with the first seed value corresponding to the program-interrupted page.

12. The method according to claim 9, wherein the recovering comprises re-randomizing the data of the program-completed page with a first seed value corresponding to the program-completed page.

13. The method according to claim 12, further comprising:
storing the re-randomized data of the program-completed page in an empty page; and
validating the re-randomized data of the program-completed page.

14. The method according to claim 12, further comprising:
derandomizing the re-randomized data of the program-completed page with the first seed value corresponding to the program-completed page.

15. The method according to claim 9, wherein the detecting comprises detecting a page before an erased page in a program sequence as the program-interrupted page.

* * * * *